United States Patent

Moss

(10) Patent No.: US 9,300,222 B2
(45) Date of Patent: Mar. 29, 2016

(54) THREE-DIMENSIONAL POWER SUPPLY MODULE WITH PASSIVE STACKED OVER CAVITY

(71) Applicant: Texas Instruments Incorporated, Dallas, TX (US)

(72) Inventor: James Ignatius Moss, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/483,925

(22) Filed: Sep. 11, 2014

(65) Prior Publication Data

US 2015/0070850 A1   Mar. 12, 2015

Related U.S. Application Data

(60) Provisional application No. 61/876,601, filed on Sep. 11, 2013, provisional application No. 61/877,103, filed on Sep. 12, 2013.

(51) Int. Cl.

| | |
|---|---|
| *H05K 7/00* | (2006.01) |
| *H02M 7/00* | (2006.01) |
| *H01L 29/00* | (2006.01) |
| *H05K 1/18* | (2006.01) |
| *H02M 3/158* | (2006.01) |

(52) U.S. Cl.
CPC .............. *H02M 7/003* (2013.01); *H01L 29/00* (2013.01); *H05K 1/181* (2013.01); *H02M 3/158* (2013.01); *H05K 2201/1003* (2013.01); *H05K 2201/10166* (2013.01); *H05K 2201/10515* (2013.01); *Y02P 70/611* (2015.11)

(58) Field of Classification Search
USPC ......... 361/721, 728–729, 760, 761, 767, 777, 361/780, 781; 307/139, 140, 147; 375/147, 375/150, 139; 714/100, 22, 14; 315/209 R; 713/300, 320, 321, 323
See application file for complete search history.

(56) References Cited

U.S. PATENT DOCUMENTS 5,353,498 A * 10/1994 Fillion .................. H01L 21/568
257/E21.505
5,914,534 A *  6/1999 Todd ...................... H05K 1/119
257/686
7,236,368 B2 *  6/2007 Maxwell .............. H05K 1/0203
174/15.2

(Continued)

OTHER PUBLICATIONS

"Synchronous Buck NexFET™ Power Block II," Data Sheet, Texas Instruments Incorporated, 2013, www.ti.com.

*Primary Examiner* — Hung S Bui
(74) *Attorney, Agent, or Firm* — Andrew Viger; Frank D. Cimino

(57) ABSTRACT

A power converter sub-assembly/module includes a power switching assemblage defining a cavity within which can be mounted a driver IC. The power switching assemblage includes a load inductor component stack attached to a power transistor block and an interconnect spacer block, defining a cavity between the two blocks. The power transistor block includes a high and low side FETs attached side-by-side to a switch-node metal carrier that includes an attach-surface opposite the FETs. The power switching assemblage is mountable to an interconnect surface that includes connection pads VIN, VOUT, GND, HG (high-side gate) and LG low-side gate). For a module configuration, the power switching assemblage is combined with a driver IC that provides high (HG) and low (LG) gate drive—the power switching assemblage and the driver IC are mounted to a module interconnect substrate, with the driver IC mounted within the cavity of the power switching assemblage.

10 Claims, 4 Drawing Sheets

(56) References Cited

U.S. PATENT DOCUMENTS

| | | | |
|---|---|---|---|
| 7,876,577 B2 * | 1/2011 | Weber | H05K 1/183 174/260 |
| 8,431,979 B2 | 4/2013 | Herbsommer et al. | |
| 8,701,272 B2 * | 4/2014 | Lotfi | H01F 17/04 29/602.1 |
| 8,760,872 B2 | 6/2014 | Herbsommer et al. | |
| 2014/0300206 A1 * | 10/2014 | Moes | H02M 7/5387 307/104 |

* cited by examiner

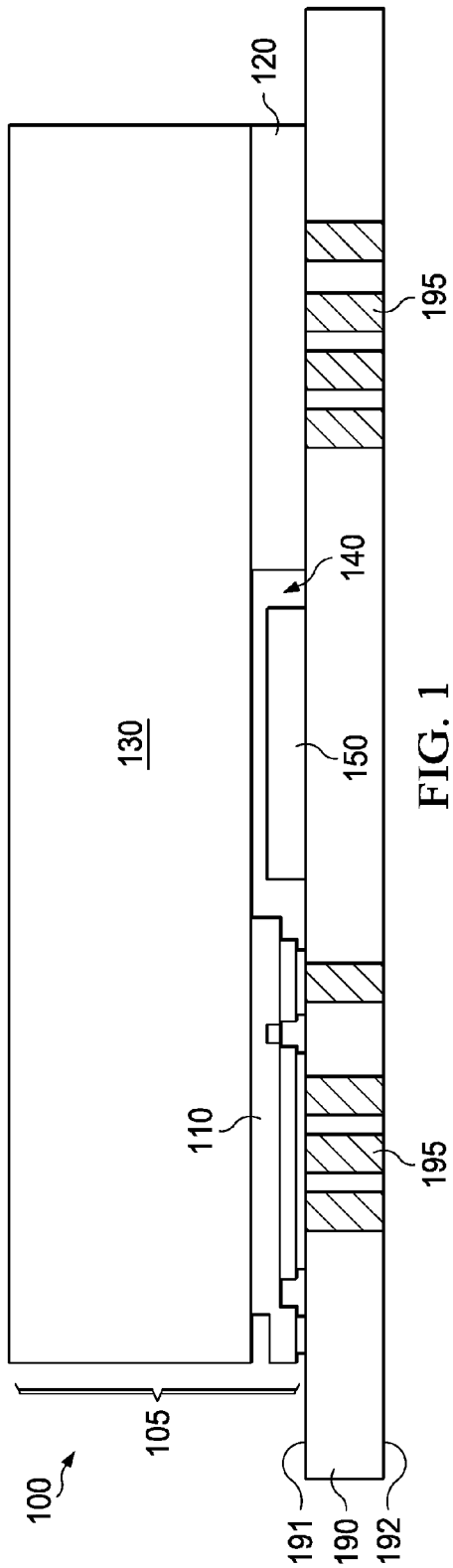
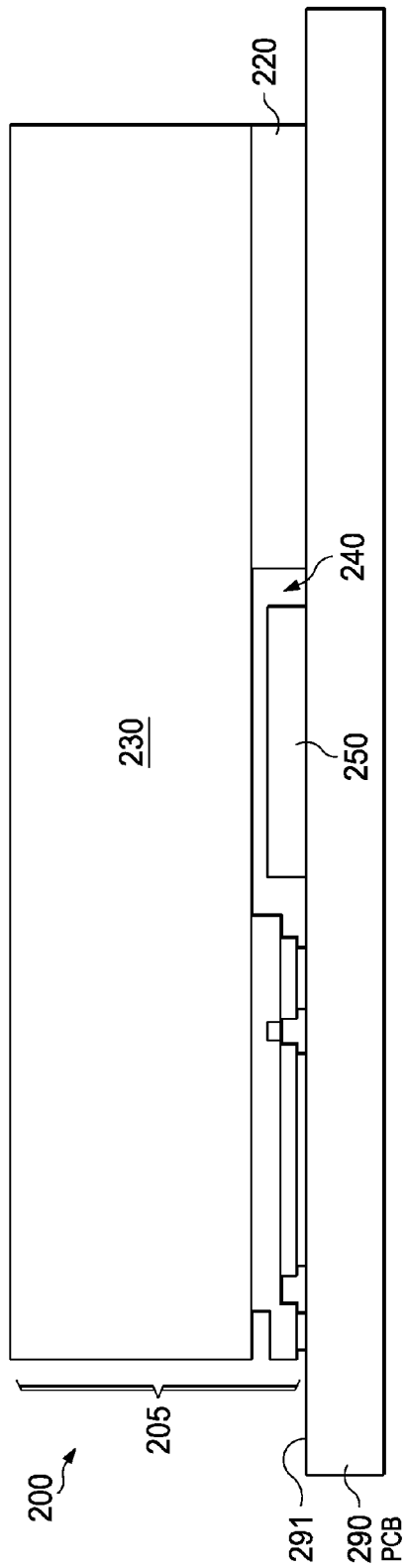

THREE-DIMENSIONAL POWER SUPPLY MODULE WITH PASSIVE STACKED OVER CAVITY

CROSS-REFERENCE TO RELATED APPLICATIONS

Priority is hereby claimed under USC §119(e) to: (a) U.S. Provisional Application 61/876,601, filed 11 Sep. 2013, and (b) U.S. Provisional Application 61/877,103, filed 12 Sep. 2013.

BACKGROUND

1. Technical Field

This Patent Document relates three-dimensional packaging techniques, such as for switched mode power modules.

2. Related Art

Three-dimensional semiconductor packages incorporate/stack active and passive circuits/components in a single package. Stacking reduces package footprint, improves power density and simplifies assembly.

One application for three-dimensional packaging is power modules for switched mode power supplies (SMPS), which are mountable as a module to a PCBA (printed circuit board assembly). An example SMPS power module includes: power transistors, a load inductor and a driver IC (integrated circuit). The power transistors, for example, high and low side power FETs (half-bridge) are coupled to the load inductor at a switch node, and switched to control power transfer through the load inductor to the load. The driver IC provides gate drive switching control for the power FETs, including feedback control, to supply regulated power to the load, at a regulated load voltage (on a separate load capacitor).

U.S. Pat. No. 8,760,872 describes a stacked power converter package that includes a half-bridge power FET composite (high and low side FETs attached to a switch-node metal carrier), attached to the underside of a sleeve-wrapped load inductor package operable as a heat sink. The driver IC is packaged separately. The half-bridge power FET composite is designated in this Patent Document as a power block, and described further in the Description below. Basically, the power block assemblage includes vertical high and low side NFETs, attached side-by-side to a metal-carrier acting as a switch node. The high-side FET is fabricated drain-down, with a top-side source attached to the switch-node metal carrier, and an underside drain attached to a input VIN pad/terminal, and the low-side FET is fabricated source-down, with a top-side drain attached to the metal-carrier switch node, and an underside source attached to a ground GND pad. A load inductor is wrapped by a metal sleeve in touch with (basically, coextensive with) the opposite surface of the power block metal carrier, and functions to spread and radiate the heat generated by the switching power FETs.

While this Background information is presented in the context of three-dimensional power module applications, the present Patent Document is not limited to such applications, but is more generally directed to three-dimensional packaging techniques.

BRIEF SUMMARY

This Brief Summary is provided as a general introduction to the Disclosure provided by the Detailed Description and Figures, summarizing some aspects and features of the disclosed invention. It is not a complete overview of the Disclosure, and should not be interpreted as identifying key elements or features of the invention, or otherwise characterizing or delimiting the scope of the invention disclosed in this Patent Document.

The Disclosure describes apparatus and methods adaptable for power conversion based on a power converter sub-assembly that can be configured as a power converter module, mounted on a module interconnect substrate that is mountable to a PCBA, or mounted directly to the PCBA as a PCBA power converter sub-assembly. In a configuration as a half-bridge switched mode power converter, the power converter sub-assembly includes a load inductor component configured for stacked attachment to a power transistor block and an interconnect spacer block, such that, when mounted, the load inductor component, power transistor block and interconnect spacer block form a power switching assemblage that defines a cavity, with the load inductor component suspended over the cavity.

The power transistor block includes a high-side FET and a low-side FET attached side-by-side to a switch-node metal carrier: (a) the high-side drain-down FET including a source attached to the switch-node metal carrier, an underside drain with a VIN input, and a gate with an underside HG input; and (b) the low-side source-down FET including a drain attached to the switch-node metal carrier, an underside source with a ground GND terminal, and a gate with an underside LG input. The interconnect spacer block is configured to provide electrical interconnection between a top-side attachment surface and an underside VOUT output.

This power switching assemblage is mountable to an interconnect surface that includes connection pads VIN, VOUT, GND, HG and LG, and including a cavity area. For a power converter module configuration, the power switching assemblage can be combined with a driver IC configured to provide high-side gate drive through an HG output, and low-side gate drive through an LG output, and mounted to a module interconnect substrate carrier adapted for mounting on a circuit board, and including a module interconnect surface with connection pads VIN, VOUT, GND, HG and LG, and an cavity area.

As either a power converter module or PCBA sub-assembly, the power switching assemblage is mountable to the interconnect surface, with the power transistor block mountable adjacent the cavity area with its VIN input and GND terminal connectable respectively to the VIN and GND pads, and the interconnect spacer block mountable adjacent the cavity area, opposite the power transistor block, with its VOUT output connectable to the VOUT pad. The load inductor component is stack attachable to the switch-node metal carrier of the power transistor block, and to the top-side attachment surface of the interconnect spacer, such that, when mounted, the load inductor component, power transistor block and interconnect spacer block form a power switching assemblage that defines a cavity, with the load inductor component suspended over the cavity area.

For power converter module and PCBA sub-assembly configurations that include a driver IC configured to provide high-side gate drive through an HG output, and low-side gate drive through an LG output, the driver IC mountable in the cavity area, with its HG and LG outputs connectable respectively to the HG and LG pads.

Either the module or sub-assembly configurations can be configured as a full-bridge switch mode power transformer by replacing the interconnect spacer block with a second power transistor block (the load inductor component is configured as a primary of the transformer).

Other aspects and features of the invention claimed in this Patent Document will be apparent to those skilled in the art from the following Disclosure.

BRIEF DESCRIPTION OF THE DRAWINGS

FIG. 1 illustrates an example embodiment of a three-dimensional half-bridge power converter module configured for operation as a half-bridge switched-mode power converter, including a stacked power-switching assemblage and a driver IC mounted to a module interconnect substrate carrier, the power-switching assemblage including a load inductor component attached to (stacked over) a half-bridge power block and an interconnect spacer block, forming a cavity for the driver IC, the module interconnect substrate carrier including interconnect traces on a mounting surface, and in this example embodiment interconnect VIAs to the underside of the module interconnect substrate.

FIG. 2 illustrates an example embodiment of a three-dimensional power converter sub-assembly mounted to a PCBA (printed circuit board assembly) for operation as a half-bridge switched mode power converter, the power converter sub-assembly including a stacked power-switching assemblage and, for this example embodiment, a driver IC, mounted to the PCBA interconnect surface, the power-switching assemblage including a load inductor component attached to (stacked over) a half-bridge power block and an interconnect spacer block, forming a cavity, such as for mounting the driver IC.

DETAILED DESCRIPTION

Figure 3:
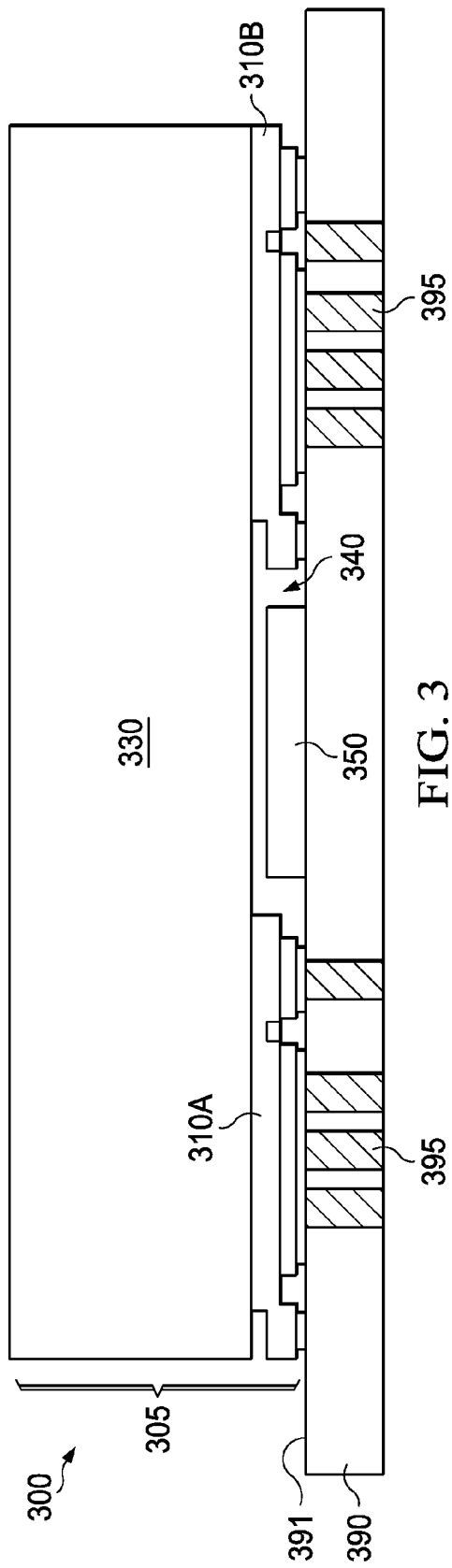
FIG. 3 illustrates an example embodiment of a three-dimensional power module configured as a full-bridge power transformer, with the power-switching assemblage including two half-bridge power blocks configured as a full-bridge (i.e., with a second power block replacing the interconnect spacer block), and with the load inductor component configured as the primary of the transformer.

This Description and the Figures constitute a Disclosure of example embodiments and applications that illustrate various features and advantages of the invention, aspects of which are defined by the Claims. Known circuits, functions and operations are not described in detail to avoid unnecessarily obscuring the principles and features of the invention.

In brief overview, a power converter sub-assembly can be configured as a power converter module, mounted on a module interconnect substrate that is mountable to a PCBA (printed circuit board assembly), or mounted directly to the PCBA as a power converter PCBA sub-assembly. In a configuration as a half-bridge switched mode power converter, the power converter sub-assembly includes a load inductor component configured for stacked attachment to a power transistor block and an interconnect spacer block, such that, when mounted, the load inductor component, power transistor block and interconnect spacer block form a power switching assemblage that defines a cavity, with the load inductor component suspended over the cavity. The power transistor block includes a high-side FET and a low-side FET attached side-by-side to a switch-node metal carrier: (a) the high-side drain-down FET including a source attached to the switch-node metal carrier, an underside drain with a VIN input, and a gate with an underside HG input; and (b) the low-side source-down FET including a drain attached to the switch-node metal carrier, an underside source with a ground GND terminal, and a gate with an underside LG input. The interconnect spacer block is configured to provide electrical interconnection between a top-side attachment surface and an underside VOUT output. This power switching assemblage is mountable to an interconnect surface that includes connection pads VIN, VOUT, GND, HG and LG, and including a cavity area. For a power converter module configuration, the power switching assemblage can be combined with a driver IC configured to provide high-side gate drive through an HG output, and low-side gate drive through an LG output, and mounted to a module interconnect substrate carrier adapted for mounting on a circuit board, and including a module interconnect surface with connection pads VIN, VOUT, GND, HG and LG, and an cavity area.

As either a power converter module or PCBA sub-assembly, the power switching assemblage is mountable to the interconnect surface, with the power transistor block mountable adjacent the cavity area with its VIN input and GND terminal connectable respectively to the VIN and GND pads, and the interconnect spacer block mountable adjacent the cavity area, opposite the power transistor block, with its VOUT output connectable to the VOUT pad. The load inductor component is stack attachable to the switch-node metal carrier of the power transistor block, and to the top-side attachment surface of the interconnect spacer, such that, when mounted, the load inductor component, power transistor block and interconnect spacer block form a power switching assemblage that defines a cavity, with the load inductor component suspended over the cavity area. For power converter module and PCBA sub-assembly configurations that include a driver IC configured to provide high-side gate drive through an HG output, and low-side gate drive through an LG output, the driver IC mountable in the cavity area, with its HG and LG outputs connectable respectively to the HG and LG pads.

FIG. 2 illustrates an example embodiment of a three-dimensional half-bridge power converter module 100 configured for operation as a half-bridge switched-mode power converter, such as a synchronous buck converter. Power converter module 100 is assembled/packaged for mounting to a PCBA (printed circuit board assembly).

Power converter module 100 includes a stacked power-switching assemblage 105 and a driver IC 150 mounted to a module interconnect substrate 190. Power-switching assemblage 105 includes a power block 110, with high-side and low-side switching FETs, and an interconnect spacer block 120. A load inductor component 130 is stack attached to power block 110 and interconnect spacer block 120, such that the load inductor component, power block and interconnect spacer block define a cavity 140, within which is mounted driver IC 150.

For this example embodiment of a power converter module, module interconnect substrate carrier 190 includes a module interconnect surface 191 and an underside mounting surface 192. Interconnect VIAs 193 provide electrical connection from connection pads on module interconnect surface 191 to underside mounting surface 192. In particular, VIAs 193 provide electrical connection from VIN, VOUT and GND pads on module interconnect surface 191 (see FIG. 4) to corresponding terminals on module underside mounting surface 192 (enabling connection to corresponding PCBA pads).

Module interconnect substrate carrier 190 can include any suitable structure that provides a module interconnect surface, and means to mount power converter module 100 to a PCBA, including providing appropriate interconnect. Other example interconnect/mounting structures include lead frame, and packages with interconnect pins.

FIG. 2 illustrates an example alternate embodiment of a three-dimensional half-bridge power converter sub-assembly 200 configured for operation as a half-bridge switched-mode power converter. Power converter sub-assembly 200 includes a stacked power-switching assemblage 205 and a driver IC 150. For this alternate embodiment, the power converter sub-assembly components are configured for direct mounting of the power converter components to a PCBA 290, rather than being separately configured as a module that is mounted to the PCBA, as in FIG. 1.

Power-switching assemblage 205 includes a power block 210 (high-side and low-side switching FETs) and an interconnect spacer block 220. A load inductor component 230 is stack attached to power block 210 and interconnect spacer block 220, such that the load inductor, power transistor block and interconnect spacer block define a cavity 240, within which is mounted driver IC 250. For this example alternate embodiment of a power converter sub-assembly, PCBA 290 includes an interconnect surface 291, with connection pads VIN, VOUT, GND, HG and LG (see FIG. 4).

Figure 4:
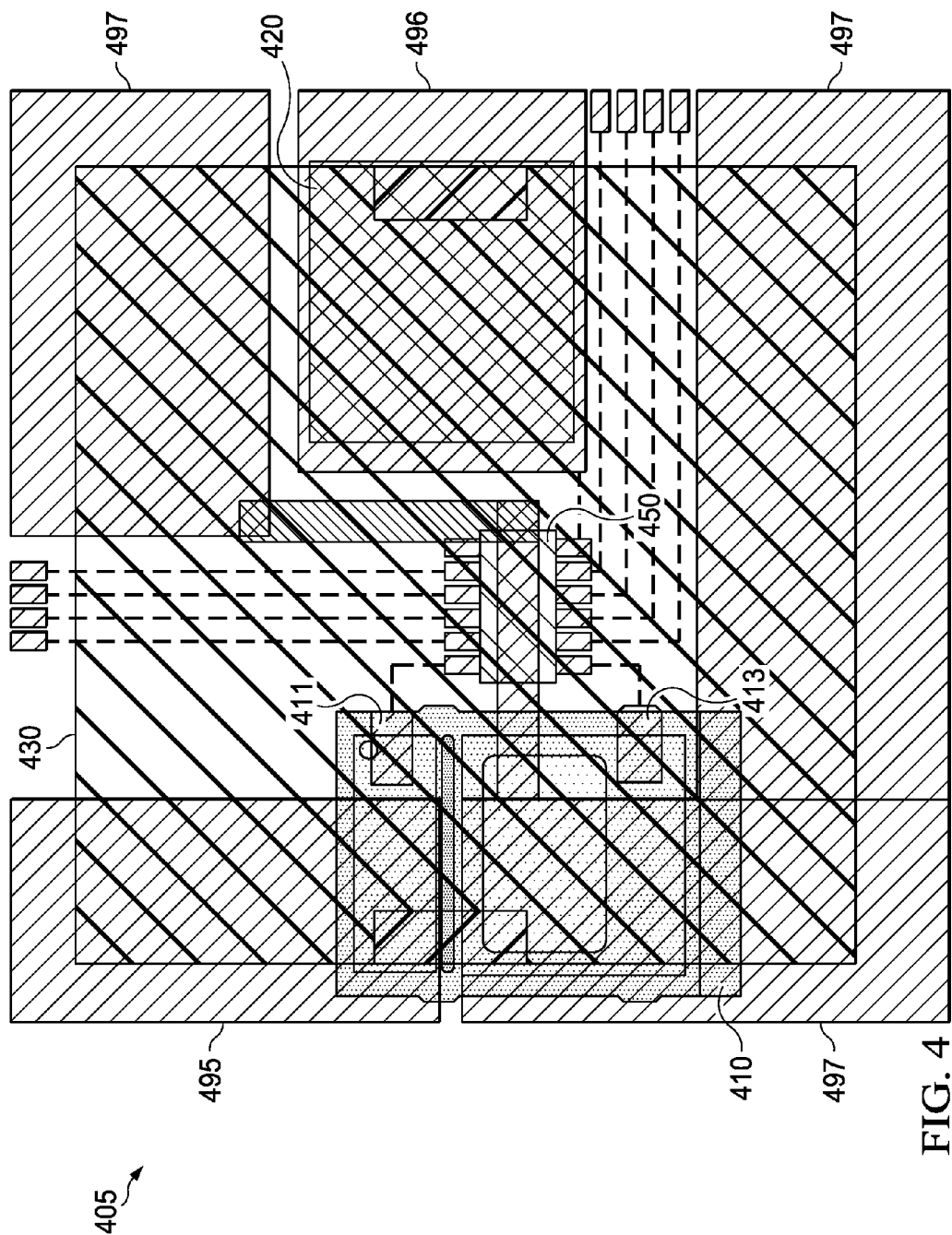
FIG. 4 illustrates a top-side multi-layer view of an example embodiment of a three-dimensional power converter sub-assembly such as illustrated in FIGS. 1-3, including a power-switching assemblage (load inductor component, power block and interconnect spacer block or second power block) and a driver IC, and illustrating interconnect traces.

FIG. 4 illustrates a top-side multi-layer view of an example embodiment of a three-dimensional power converter sub-assembly 400, such as illustrated in FIGS. 1 and 2. Power converter sub-assembly 400 includes a power-switching assemblage 405 and a driver IC 450.

Power-switching assemblage 405 includes a power block 410 and an interconnect spacer block 420, and a stacked load inductor component 430. Driver IC 450 is within a cavity (FIG. 1, 140) defined by power block 410 and interconnect spacer block 420, and the stacked load inductor component 430.

Also illustrated are HG and LG connection pads for power converter sub-assembly 400: VIN 495, VOUT 496 and GND 497, and HG 411 and LG 413. Associated with power block 410 are the connection pads high-gate HG 411 and low-gate LG 413 respectively for the high-side and low-side FETs, as well as the connection pads for VIN 495 and GND 497. Interconnect spacer block 420 connects the output end of load inductor component 430 to the VOUT 496 connection pad.

Figure 5:
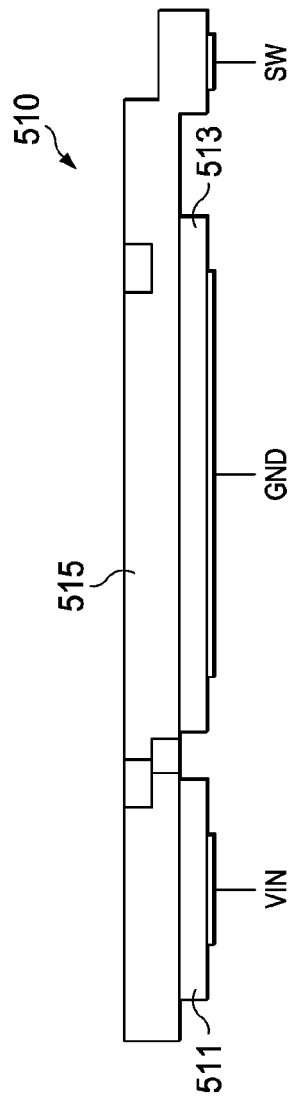
FIG. 5 is a functional illustration of a half-bridge power block, including high/low-side FETs, and the switch-node metal carrier.

FIG. 5 is a functional illustration of a half-bridge power block 510, including high/low-side (or synchronous or sync) FETs 511/513, and switch-node metal carrier 515. High-side FET 511 and low-side FET 513 attached side-by-side to switch-node metal carrier 515 (such as a copper plate).

In this example, low-side FET 513 has a larger area than high-side FET 511, and the FETs have substantially the same thickness (preferably about 0.10 mm). With regard to a comparison of the physical areas and active areas of high and low side FETs 511/513, for the example synchronous buck converter, buck duty cycle determines the ratio of the active areas needed for the high-side FET relative to the low-side FET, since the resistance $R_{ON}$ of the ON state is inversely proportional to the active chip area. If the anticipated duty cycle is low most of the time (for example, <0.5), high-side FET 511 is off and not conducting during most of the operation; and low-side FET 513 is conducting most of the cycle time. To reduce conduction losses of the buck converter ($P_{LOSS}=I^2$ $R_{ON}$) it is favorable to have low-side FET 513 with an active area equal to or larger than the active area of high-side FET 511, so that low-side FET 513 would have a physical area equal to or larger than the physical area of high-side FET 511.

Metal carrier 515 has a recess or cavity of depth suitable to attach the FETs 511/513 onto the recess bottom using a solder layer. Alternatively, the carrier metal can be provided in two different thicknesses, with a thinner portion for attaching the FETs and a thicker portion serving as an output terminal.

High-side FET 513 is fabricated drain-down, with a source attached to switch-node metal carrier 515 and an underside drain providing connection to VIN input pad 595. High-side FET 511 includes a gate with an underside HG input, providing connection to the HG pad (FIG. 4, 411). Low-side FET 513 is fabricated source-down, with a drain attached to switch-node metal carrier 515 and an underside source providing a ground terminal connection to ground GND pad 497. Low-side FET 513 includes a gate with an underside LG input, providing connection to the LG pad (FIG. 4, 413).

Referring to FIG. 2, power switching assemblage 205 includes power block 210, interconnect spacer block 220 and load inductor component 230. Power block 210 is mounted to PCBA 290 (interconnect surface 291), adjacent cavity area 240, with the VIN input and GND terminal connected respectively to the VIN and GND pads (FIGS. 4, 495 and 497). Interconnect spacer block 220 is configured to provide electrical interconnection between a top-side attachment surface and an underside VOUT output, and is mounted to interconnect surface 291 adjacent the cavity area 240, opposite power block 210, with the VOUT output connected to the VOUT pad (FIG. 4, 496).

Load inductor component 240 is stack attached to power block 210 (FIG. 5, switch-node metal carrier 515), and to the top-side attachment surface of interconnect spacer block 230, such that the load inductor component is suspended over cavity area 240. That is, load inductor component 240, power block 210 and interconnect spacer block 220 define cavity 240.

For the example embodiment of a power converter 200, a driver IC 250 is mounted within cavity 240.

Figure 6:
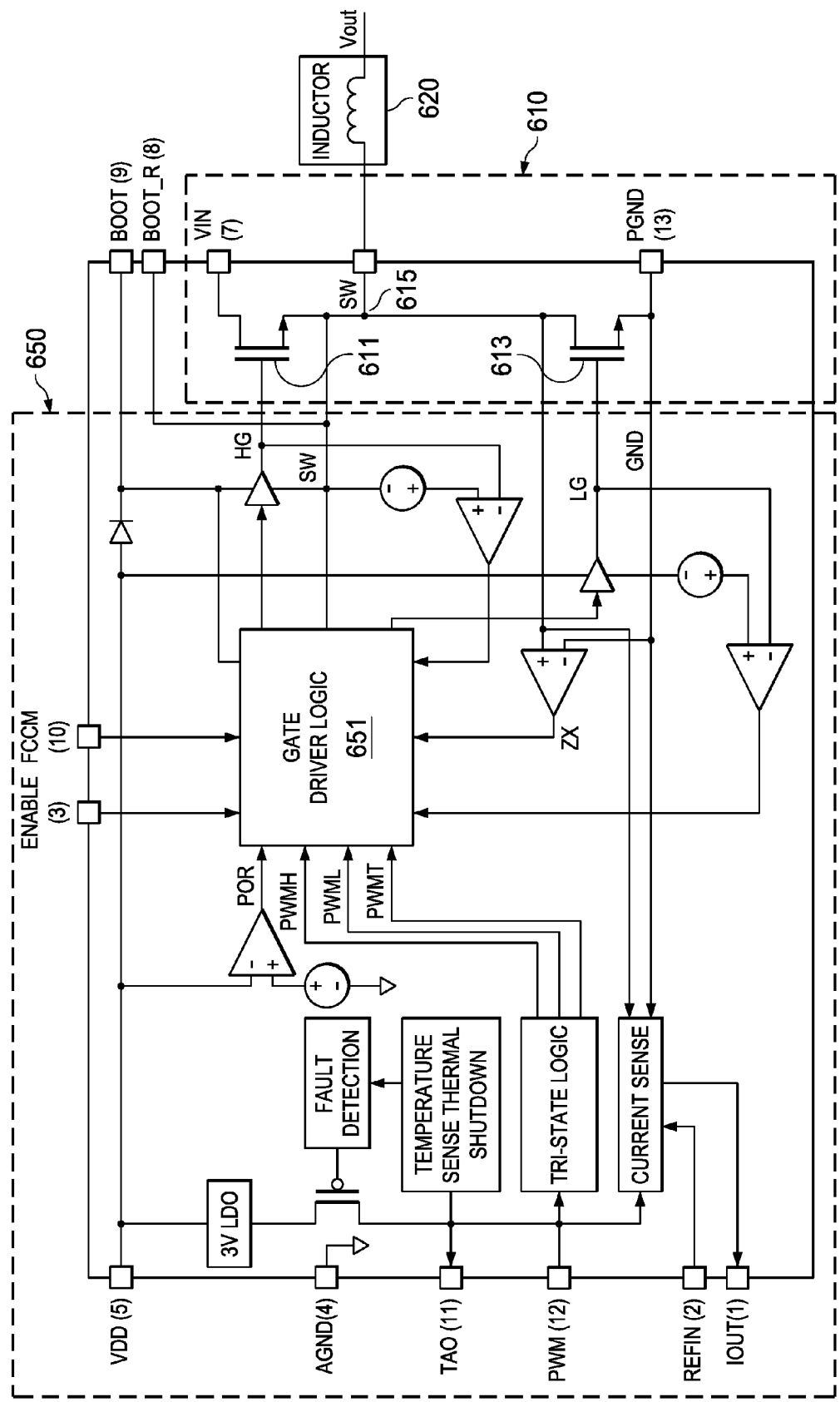
FIG. 6 illustrates an example embodiment of a driver IC, and functionally illustrating gate connection to a half-bridge power block (high/low-side FETs), and a switch node connected to a load inductor.

FIG. 6 illustrates an example embodiment of a driver IC 650. Driver IC 650 is coupled to a power block functionally illustrated as 610, including high/low side FETs 611/613.

Driver IC 650 includes gate drive logic 651, providing gate drive for power block high/low side FETs 611/613. Referring also to FIG. 4, driver IC 650 provides high-side gate drive HG to the HG input pad 411, and low-side gate drive LG to the LG input pad 413. Gate drive logic 651 controls switching of high/low side FETs 611/613, controlling switched mode power output from switch node 615 (FIG. 5, switch-node metal carrier 515), through load inductor 620.

For the example configuration as a synchronous buck converter, high/low side FETs 511/513 are arranged in a half-bridge configuration where the high-side FET connects the VIN input voltage to load inductor 620, and the low-side FET connects the load inductor to ground. According to conventional power supply configurations, load inductor 620 and an output (load filter) capacitor form an output filter. High and low side FETs 511/513 produce the duty-cycle modulated square wave that is then low-pass filtered, resulting in the output voltage. Low-side FET 513, which acts as a synchronous rectifier, is commonly referred-to as the sync FET, and high-side FET 511 with the low duty-cycle is commonly referred to as the control FET.

Driver IC 650 can provide translation for the high side FET 611, as well as other functions, such as conditioning, temperature monitoring and current monitoring. Interconnect on the PCBA can include bypass, output and boot capacitors.

FIG. 3 illustrates an example embodiment of a three-dimensional power module 300 configured as a full-bridge power transformer module. In this configuration, the power-switching assemblage includes two half-bridge power blocks 310A/B configured as a full-bridge, i.e., with a second power block 310B replacing the interconnect spacer block (FIGS. 1, 150), and with appropriate connections on module interconnect surface 391. Load inductor component 330 is configured as the primary of the transformer, connected to each pair of FETs.

Other configurations could include two power blocks and two spacers, four power blocks or some combination of power blocks, spacers and diodes.

The Disclosure provided by this Description and the Figures sets forth example embodiments and applications, including associated operations and methods, that illustrate various aspects and features of the invention. These example embodiments and applications may be used by those skilled in the art as a basis for design modifications, substitutions and alternatives to construct other embodiments, including adaptations for other applications, Accordingly, this Description does not limit the scope of the invention, which is defined by the Claims.

The invention claimed is:

1. A power converter module, adapted for mounting on a circuit board, and operable as a half-bridge switched mode power converter, comprising:
    a module interconnect substrate carrier adapted for mounting on a circuit board, and including a module interconnect surface with connection pads VIN, VOUT, GND, HG and LG, and a cavity area;
    a driver IC configured to provide high-side gate drive through an HG output, and low-side gate drive through an LG output, the driver IC mounted to the module interconnect surface in the cavity area, with the HG and LG outputs connected respectively to the HG and LG pads;
    a power transistor block including a high-side FET and a low-side FET attached side-by-side to a switch-node metal carrier:
        the high-side drain-down FET including a source attached to the switch-node metal carrier, an underside drain with a VIN input, and a gate with an underside HG input; and
        the low-side source-down FET including a drain attached to the switch-node metal carrier, an underside source with a ground GND terminal, and a gate with an underside LG input;
    the power transistor block mounted to the module interconnect surface adjacent the cavity area with the VIN input and GND terminal connected respectively to the VIN and GND pads;
    an interconnect spacer block configured to provide electrical interconnection between a top-side attachment surface and an underside VOUT output, the interconnect spacer block mounted to the module interconnect surface adjacent the cavity area, opposite the power transistor block, with the VOUT output connected to the VOUT pad; and
    a load inductor component configured for stacked attachment to the switch-node metal carrier of the power transistor block, and to the top-side attachment surface of the interconnect spacer block, the load inductor component suspended over the cavity area;
    such that the load inductor, power transistor block and interconnect spacer define a cavity.

2. The module of claim 1, wherein the module interconnect substrate carrier further includes an underside mounting surface, and interconnect VIAs extending from the module interconnect surface to the underside mounting surface, and providing electrical connection from the VIN, VOUT and GND pads to corresponding terminals on the underside mounting surface (connectable to corresponding pads on the circuit board).

3. The module of claim 1, wherein the interconnect spacer block is replaced by a second power transistor block, the power converter module configured for operation as a full-bridge power transformer, with the load inductor component configured as a primary of the transformer.

4. A power converter sub-assembly, configured for mounting to a circuit board for operation as a half-bridge switched mode power converter, comprising:
    a power-switching aggregation, including
        a load inductor component;
        a power transistor block including a high-side FET and a low-side FET attached side-by-side to a switch-node metal carrier:
            the high-side drain-down FET including a source attached to the switch-node metal carrier, an underside drain with a VIN input, and a gate with an underside HG input; and
            the low-side source-down FET including a drain attached to the switch-node metal carrier, an underside source with a ground GND terminal, and a gate with an underside LG input; and
        an interconnect spacer block configured to provide electrical interconnection between a top-side attachment surface and an underside VOUT output;
    a driver IC configured to provide high-side gate drive through an HG output, and low-side gate drive through an LG output;
    the power switching aggregation and the driver IC mountable as a sub-assembly to an interconnect surface of the circuit board, the interconnect surface including connection pads VIN, VOUT, GND, HG and LG, and including a cavity area;
    the driver IC mountable in the cavity area, with its HG and LG outputs connectable respectively to the HG and LG pads;
    the power transistor block mountable adjacent the cavity area with its VIN input and GND terminal connectable respectively to the VIN and GND pads;
    the interconnect spacer block mountable adjacent the cavity area, opposite the power transistor block, with its VOUT output connectable to the VOUT pad; and
    the load inductor component configured for stacked attachment to the switch-node metal carrier of the power transistor block, and to the top-side attachment surface of the interconnect spacer;
    such that, when mounted, the load inductor component, power transistor block and interconnect spacer block form a power switching assemblage that defines a cavity, with the load inductor component suspended over the cavity area.

5. The sub-assembly of claim 4, wherein the interconnect spacer block is replaced by a second power transistor block, the power converter sub-assembly configured for operation as a full-bridge power transformer, with the load inductor component configured as a primary of the transformer.

6. The sub-assembly of claim 5, wherein the load inductor component, the power transistor block and the second power transistor block are configured as a power switching assemblage, with
- the load inductor component stack attached to the switch-node metal carrier of the power transistor block, and to the switch-node metal carrier of the second power transistor block, such that the load inductor, power transistor block and second power transistor block define the cavity;
- the power switching assemblage mountable to the interconnect surface of the circuit board, with a mounted driver IC within the cavity.

7. The sub-assembly of claim 4, wherein the load inductor component, power transistor block and interconnect spacer block are configured as a power switching assemblage, with
- the load inductor component stack attached to the switch-node metal carrier of the power transistor block, and to the top-side attachment surface of the interconnect spacer block, such that the load inductor, power transistor block and interconnect spacer define the cavity;
- the power switching assemblage mountable to the interconnect surface of the circuit board, with a mounted driver IC within the cavity.

8. A circuit board assembly including a power converter circuit mounted to the circuit board assembly for operation as a half-bridge switched mode power converter, comprising:
- a circuit board assembly including an interconnect surface with connection pads VIN, VOUT, GND, HG and LG, and with a cavity area;
- a power-switching assemblage, including
    - a power transistor block including a high-side FET and a low-side FET attached side-by-side to a switch-node metal carrier:
        - the high-side drain-down FET including a source attached to the switch-node metal carrier, an underside drain with a VIN input, and a gate with an underside HG input; and
        - the low-side source-down FET including a drain attached to the switch-node metal carrier, an underside source with a ground GND terminal, and a gate with an underside LG input;
        - the power transistor block mounted to the interconnect surface adjacent the cavity area with the VIN input and GND terminal connected respectively to the VIN and GND pads;
    - an interconnect spacer block configured to provide electrical interconnection between a top-side attachment surface and an underside VOUT output, the interconnect spacer block mounted to the interconnect surface adjacent the cavity area, opposite the power transistor block, with the VOUT output connected to the VOUT pad; and
    - a load inductor component configured for stacked attachment to the switch-node metal carrier of the power transistor block, and to the top-side attachment surface of the interconnect spacer block, the load inductor component suspended over the cavity area.

9. The circuit board assembly of claim 8, further comprising a driver IC configured to provide high-side gate drive through an HG output, and low-side gate drive through an LG output, the driver IC mounted to the interconnect surface in the cavity area, with the HG and LG outputs connected respectively to the HG and LG pads.

10. The circuit board assembly of claim 8, wherein the interconnect spacer block is replaced by a second power transistor block, the power converter circuit configured for operation as a full-bridge power transformer, with the load inductor component configured as a primary of the transformer.

* * * * *